(12) United States Patent
Hiraoka et al.

(10) Patent No.: US 10,943,738 B2
(45) Date of Patent: Mar. 9, 2021

(54) THIN FILM CAPACITOR, AND METHOD OF PRODUCING THIN FILM CAPACITOR

(71) Applicant: TDK Corporation, Tokyo (JP)

(72) Inventors: Masahiro Hiraoka, Tokyo (JP); Hiroshi Takasaki, Tokyo (JP); Hitoshi Saita, Tokyo (JP)

(73) Assignee: TDK Corporation, Tokyo (JP)

( * ) Notice: Subject to any disclaimer, the term of this patent is extended or adjusted under 35 U.S.C. 154(b) by 97 days.

(21) Appl. No.: 16/359,149

(22) Filed: Mar. 20, 2019

(65) Prior Publication Data

US 2019/0295774 A1 Sep. 26, 2019

(30) Foreign Application Priority Data

Mar. 23, 2018 (JP) .............................. JP2018-056591

(51) Int. Cl.
| | |
|---|---|
| *H01G 4/33* | (2006.01) |
| *C23C 14/34* | (2006.01) |
| *H01G 4/008* | (2006.01) |
| *H01G 4/12* | (2006.01) |

(52) U.S. Cl.
CPC ............ *H01G 4/33* (2013.01); *C23C 14/3464* (2013.01); *H01G 4/008* (2013.01); *H01G 4/1227* (2013.01)

(58) Field of Classification Search
CPC ........ H01G 4/33; H01G 4/008; H01G 4/1227; C23C 14/3464
See application file for complete search history.

(56) References Cited

U.S. PATENT DOCUMENTS

| | | | | |
|---|---|---|---|---|
| 5,262,920 | A | * 11/1993 | Sakuma ................. | H01G 4/008 257/E21.009 |
| 10,658,117 | B2 | * 5/2020 | Kim ......................... | H01G 4/30 |
| 2005/0111162 | A1 | * 5/2005 | Osaka .................. | H01G 4/1227 361/271 |
| 2006/0131069 | A1 | * 6/2006 | Shimizu ............ | H01L 23/49822 174/260 |
| 2011/0005817 | A1 | * 1/2011 | Ito ........................... | H01G 4/33 174/257 |

(Continued)

FOREIGN PATENT DOCUMENTS

| | | |
|---|---|---|
| JP | 2008-124414 A | 5/2008 |
| JP | 2010-27948 A | 2/2010 |
| JP | 2014-7239 A | 1/2014 |

*Primary Examiner* — Dion Ferguson
(74) *Attorney, Agent, or Firm* — Faegre Drinker Biddle & Reath LLP

(57) ABSTRACT

A thin film capacitor comprises a first electrode, a second electrode, and a dielectric substance disposed between the first electrode 10 and the second electrode. The second electrode has a first metallic layer, an intermediate layer, and a second metallic layer in sequence in this order from the side of the dielectric substance. The first metallic layer contains a metal element M1 as a main component, and the second metallic layer contains a metal element M2 different from the metal element M1 as a main component. The intermediate layer has one or more laminate structures each having a second metal sublayer containing the metal element M2 as a main component and a first metal sublayer containing the metal element M1 as a main component in sequence from the side of the first metallic layer toward the side of the second metallic layer.

6 Claims, 9 Drawing Sheets

(56) References Cited

U.S. PATENT DOCUMENTS

| | | | |
|---|---|---|---|
| 2011/0149470 A1* | 6/2011 | Hur | H01G 4/12 |
| | | | 361/321.2 |
| 2013/0342960 A1* | 12/2013 | Saita | H01G 4/01 |
| | | | 361/305 |
| 2016/0163463 A1* | 6/2016 | Namikawa | H01G 4/30 |
| | | | 361/301.3 |
| 2018/0061577 A1* | 3/2018 | Yasuda | H01G 4/012 |
| 2018/0132355 A1* | 5/2018 | Saita | H01G 4/306 |
| 2018/0144873 A1* | 5/2018 | Lee | H01G 4/008 |
| 2018/0233287 A1* | 8/2018 | Seo | H01G 4/06 |
| 2019/0287726 A1* | 9/2019 | Yoshikawa | H01G 4/06 |

* cited by examiner

THIN FILM CAPACITOR, AND METHOD OF PRODUCING THIN FILM CAPACITOR

TECHNICAL FIELD

The present invention relates to a thin film capacitor, and a method of producing a thin film capacitor.

BACKGROUND

Electrodes having an Ni layer and a Cu layer are conventionally known as an electrode for thin film capacitors.

CITATION LIST

Patent Literature

Patent Literature 1: Japanese Unexamined Patent Publication No. 2014-7239
Patent Literature 2: Japanese Unexamined Patent Publication No. 2010-27948
Patent Literature 3: Japanese Unexamined Patent Publication No. 2008-124414

SUMMARY

As a result of research conducted by the present inventors, it was found that if heat is applied to such a thin film capacitor for packaging or the like, metals diffuse between different metallic layers in the electrode so that at least one of the layers is alloyed to increase the electric resistance, thus increasing the ESR (equivalent series resistance) of the capacitor.

The present invention then has been made in consideration of the problem above, and an object of the present invention is to provide a thin film capacitor barely increasing the ESR even if heat is applied, and a method of producing a thin film capacitor.

The thin film capacitor according to the present invention is a thin film capacitor comprising a first electrode, a second electrode, and a dielectric substance disposed between the first electrode and the second electrode. The second electrode has a first metallic layer, an intermediate layer, and a second metallic layer in sequence in this order from the side of the dielectric substance. The first metallic layer contains a metal element M1 as a main component, and the second metallic layer contains a metal element M2 different from the metal element M1 as a main component. The intermediate layer has one or more laminate structures each having a second metal sublayer containing the metal element M2 as a main component and a first metal sublayer containing the metal element M1 as a main component in sequence from the side of the first metallic layer toward the side of the second metallic layer.

According to this, because the intermediate layer of the second electrode has a laminate structure of the second metal sublayer containing the metal element M2 as the main component and the first metal sublayer containing the metal element M1 as the main component, the mutual diffusion of the metal element M1 and the metal element M2 between the first metallic layer and the second metallic layer can be suppressed, and degradation of properties of the second electrode can be suppressed even in the case of exposure to a heating step.

Here, the metal element M1 can be any one metal selected from the group consisting of Ni, Pd, Pt, Au, Ru, Rh, and Ir, and the metal element M2 can be any one metal selected from the group consisting of Cu, Cr, Au, Ru, Rh, Ir, Mo, Ti, and W.

Moreover, the intermediate layer can have 2 to 10 of the laminate structures. With an excessively small number of the laminate structures, the effect of suppressing the diffusion of atoms tends to be reduced; and with an excessively large number of the laminate structures, the electric resistance of the intermediate layer tends to increase.

Moreover, the thickness of the first metal sublayer and that of the second metal sublayer both can be 10 to 50 nm. If the thickness is excessively small, the effect of suppressing the diffusion tends to be reduced; and if the thickness is excessively large, the mutual diffusion tends to occur within the metal sublayer and the effect of suppressing the electric resistance (such as the ESR) tends to decrease.

Moreover, the first electrode can have the first metallic layer, the intermediate layer, and the second metallic layer in sequence in this order from the side of the dielectric substance.

Moreover, the first electrode can further has an additional metallic layer between the first metallic layer and the dielectric substance.

The method of producing a thin film capacitor according to the present invention comprises:

a step of alternately approaching a dielectric substance to a first target containing a metal element M1 as a main component and a second target containing a metal element M2 as a main component;

a step of having the first target release the metal element M1 therefrom during the step of alternately approaching the dielectric substance thereto to form a first metallic layer on the dielectric substance;

a step of having the second target release the metal element M2 therefrom and having the first target release the metal element M1 therefrom during the step of alternately approaching the dielectric substance thereto to form one or more laminate structures on the first metallic layer, the one or more laminate structures each having a first metal sublayer containing the metal element M1 as a main component and a second metal sublayer containing the metal element M2 as a main component; and a step of having the second target release the metal element M2 therefrom and not having the first target release the metal element M1 therefrom during the step of alternately approaching the dielectric substance thereto to form a second metallic layer containing the metal element M2 as a main component on the laminate structures.

According to the present invention, a thin film capacitor barely increasing the ESR even if heat is applied, and a method of producing a thin film capacitor are provided.

DETAILED DESCRIPTION

Figure 1:
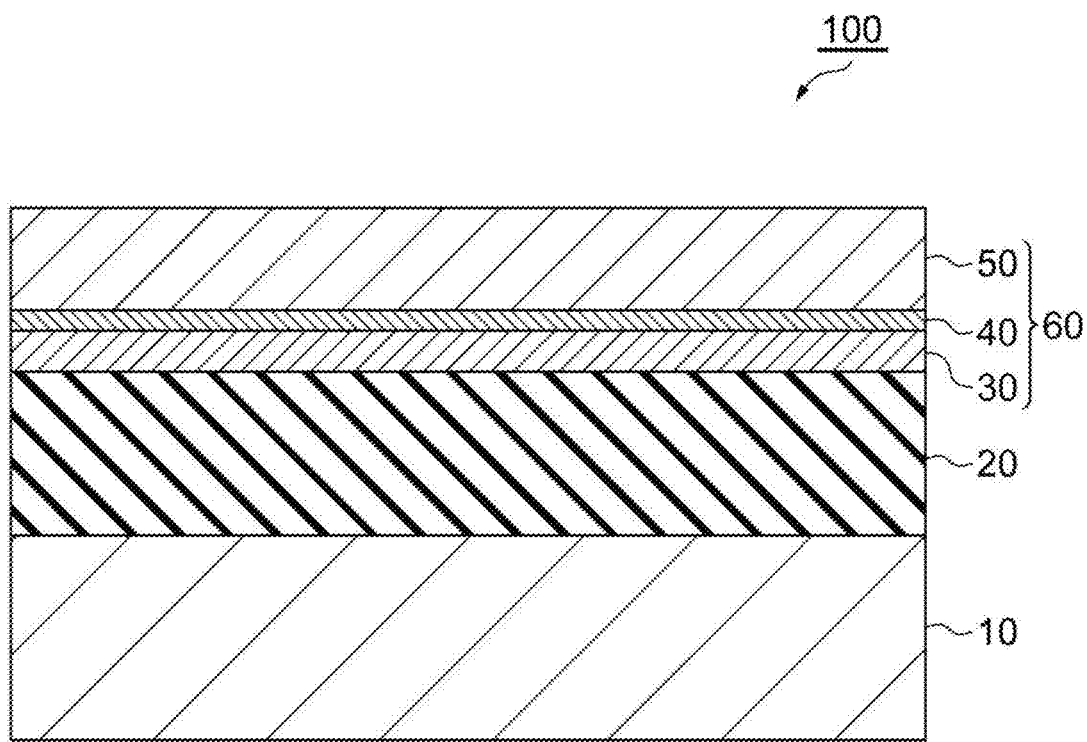
FIG. 1 is a schematic sectional view of a thin film capacitor according to first embodiment of the present invention.

Hereinafter, suitable embodiments of the present invention will be described in detail. It should be noted that the present invention will not be limited to the following embodiments. The same reference numerals will be given to the same or identical components. Moreover, although positional relations of top, bottom, left, and right are as shown in the drawings, ratios of dimensions are not limited to those shown in the drawings. Moreover, the description will be omitted if it is a duplication.

First Embodiment (Thin Film Capacitor)

As shown in FIG. 1, a thin film capacitor 100 according to a first embodiment includes a first electrode 10, a second electrode 60, and a dielectric substance 20 disposed between the first electrode 10 and the second electrode 60.

The thickness of the first electrode 10 can be 0.01 to 100 m.

The first electrode 10 can be a metallic layer. In this specification, the metal includes alloys. It is preferred that the metal of the metallic layer contain Ni as a main component. Examples of metals as the main component other than Ni include Pd, Pt, Au, Ag, Cu, and W. The main component refers to a concentration of 50 at % or more. The first electrode 10 may be a structure in which two or more metallic layer are laminated. The first electrode 10 may be a layer of a conductive oxide such as $LaNiO_3$ or NiO, rather than the metal. The first electrode 10 may be a structure of a film formed on a substrate, or may be a structure of a self-standing body as foil.

The material for the dielectric substance 20 may be a dielectric substance, and can be an oxide dielectric substance. Among these, it is preferred that the material be a perovskite-type oxide dielectric substance, which usually has a large dielectric constant, and it is particularly preferred that the material be a barium titanate-based dielectric substance. The barium titanate-based dielectric substance may be those having a Ba site partially replaced with an alkaline earth metal atom such as Ca or Sr, or may be those having a Ti site partially replaced with an atom such as Zr, Sn, or Hf. Furthermore, an atom such as a rare earth element atom, Mn, V, Nb, or Ta may be added to these dielectric substances.

It is preferable for the film thickness of the dielectric substance 20 to be 100 nm to 1000 nm. This is because if the thickness is less than 100 nm, excessive electric field intensity may be applied when a DC bias is applied to the thin film capacitor to degrade insulating resistance, so that the function as a capacitor may no longer be working. In contrast, if the thickness is more than 1000 nm, the capacitance of the capacitor per unit area is reduced and it is difficult to produce a capacitor having high capacitance.

The second electrode 60 has a first metallic layer 30, an intermediate layer 40, and a second metallic layer 50 in sequence in this order from the side of the dielectric substance 20.

The first metallic layer 30 contains a metal element M1 as a main component. The second metallic layer 50 contains a metal element M2 as a main component. The thickness of the first metallic layer 30 can be 0.1 to 2 μm. The thickness of the second metallic layer 50 can be 1 to 20 m.

The metal element M1 and the metal element M2 are not particularly limited as long as these are different metal elements from each other. In this specification, the main component means that the atomic concentration thereof in the metallic layer is more than 50%. The first metallic layer 30 and the second metallic layer 50 suitably contain the metal element M1 and the metal element M2 in an amount of 99 at % or more, respectively.

The metal element M1 is suitably any one metal selected from the group consisting of Ni, Pd, Pt, Au, Ru, Rh, and Ir from the viewpoint of not degrading the properties of the dielectric substance by reduction of the oxide dielectric substance.

The metal element M2 is suitably any one metal selected from the group consisting of Cu, Cr, Au, Ru, Rh, Ir, Mo, Ti, and W from the viewpoint of conductivity.

Figure 2:
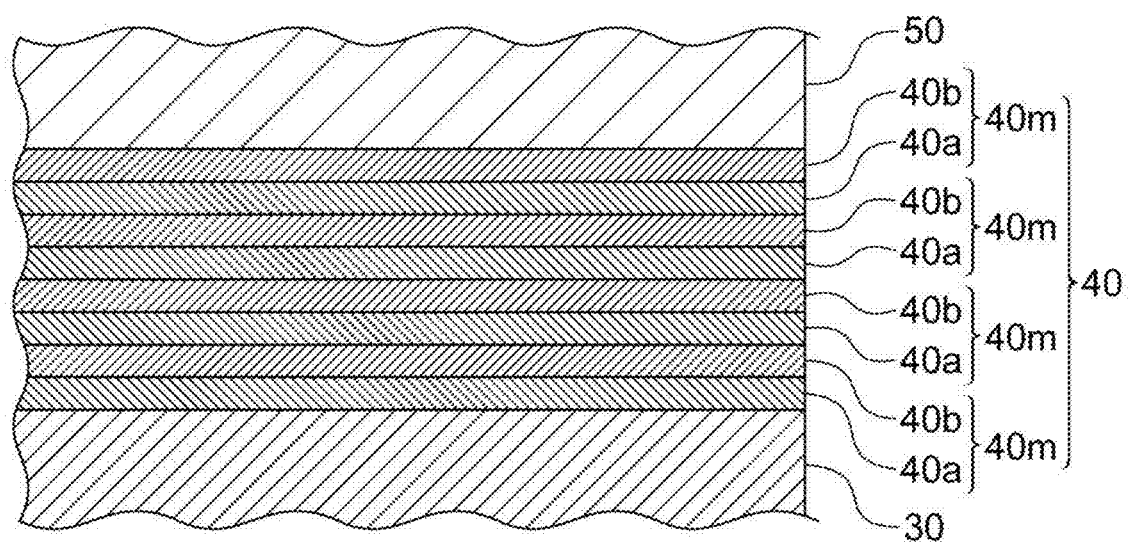
FIG. 2 is an enlarged sectional view of an intermediate layer of the thin film capacitor of FIG. 1.

As shown in FIG. 2, the intermediate layer 40 has one or more laminate structures 40*m* each having a second metal sublayer 40*a* containing the metal element M2 as a main component and a first metal sublayer 40*b* containing the metal element M1 as a main component in sequence from the side of the first metallic layer 30 toward the side of the second metallic layer 50.

The thickness of each second metal sublayer 40*a* and that of each first metal sublayer 40*b* can be 10 to 50 nm. The thickness of the second metal sublayer 40*a* and the thickness of the first metal sublayer 40*b* each may be uneven within the intermediate layer 40, for example, the thickness remoter from the dielectric substance is larger.

The number of laminate structures 40*m* can be 2 or more, and can be 10 or less. The thickness of the intermediate layer 40 can be 50 to 1000 nm.

The metal composition of the first metal sublayer 40*b* is the same as the metal composition of the first metallic layer 30, and the metal composition of the second metal sublayer 40*a* is the same as the metal composition of the second metallic layer 50.

(Mechanism)

According to such a thin film capacitor 100, because the second electrode 60 has the intermediate layer 40 having the laminate structure 40*m* of the first metal sublayer 40*b* containing the metal element M1 as a main component and the second metal sublayer 40*a* containing the metal element M2 as a main component, the mutual diffusion of the metal element M1 and the metal element M2 between the first metallic layer 30 and the second metallic layer 50 can be suppressed, and an increase in electric resistance of the second electrode 60 can be suppressed even in the case of exposure to a heating step. Thereby, the reliability is improved.

Second Embodiment

Figure 3:
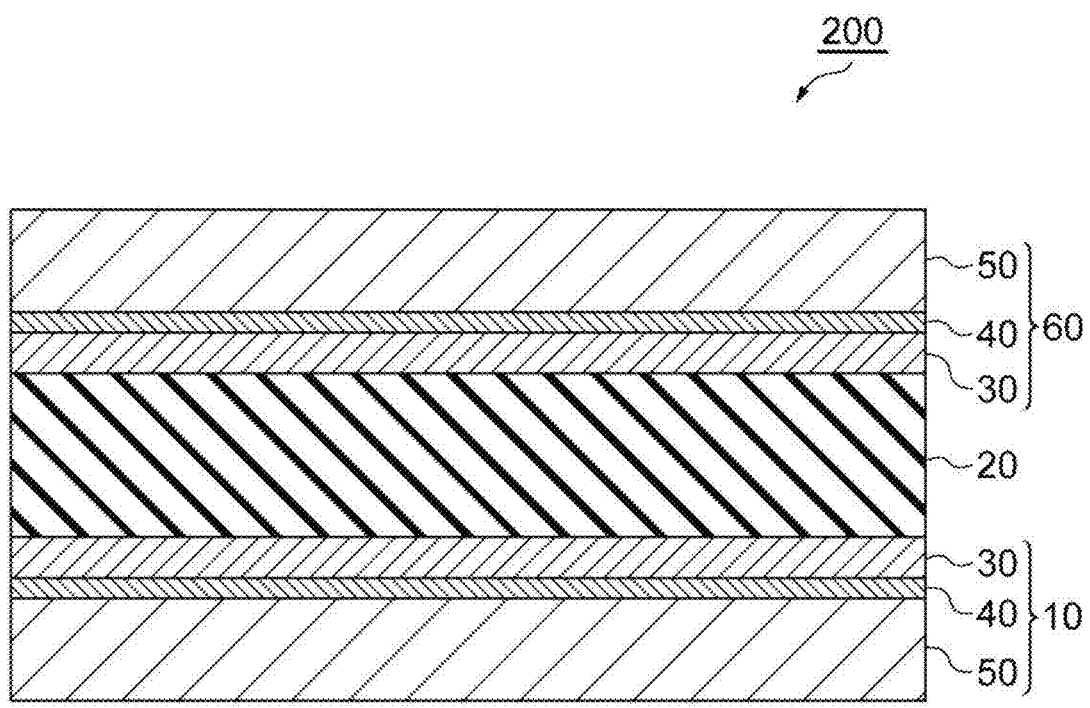
FIG. 3 is a schematic sectional view of a thin film capacitor according to a second embodiment of the present invention.

Subsequently, with reference to FIG. 3, a thin film capacitor 200 according to a second embodiment will be described.

The difference between the thin film capacitor 200 according to the present embodiment and the thin film capacitor 100 according to the first embodiment is only the first electrode 10. The first electrode 10 according to the present embodiment has a first metallic layer 30, an intermediate layer 40, and a second metallic layer 50 in sequence in this order from the side of the dielectric substance 20.

The first metallic layer 30, the intermediate layer 40, and the second metallic layer 50 in the first electrode 10 can be the same as those in the second electrode 60. Although the thicknesses of the layers and the metal elements M1 and M2 or the compositions of the metallic layers may be the same as those in the corresponding layers of the second electrode 60, those may be different from the corresponding layers of the second electrode 60.

According to the present embodiment, an increase in electric resistance after the heat treatment can further be suppressed also in the first electrode 10 in the case where the first electrode 10 is of a lamination type of different metals.

Third Embodiment

Figure 4:
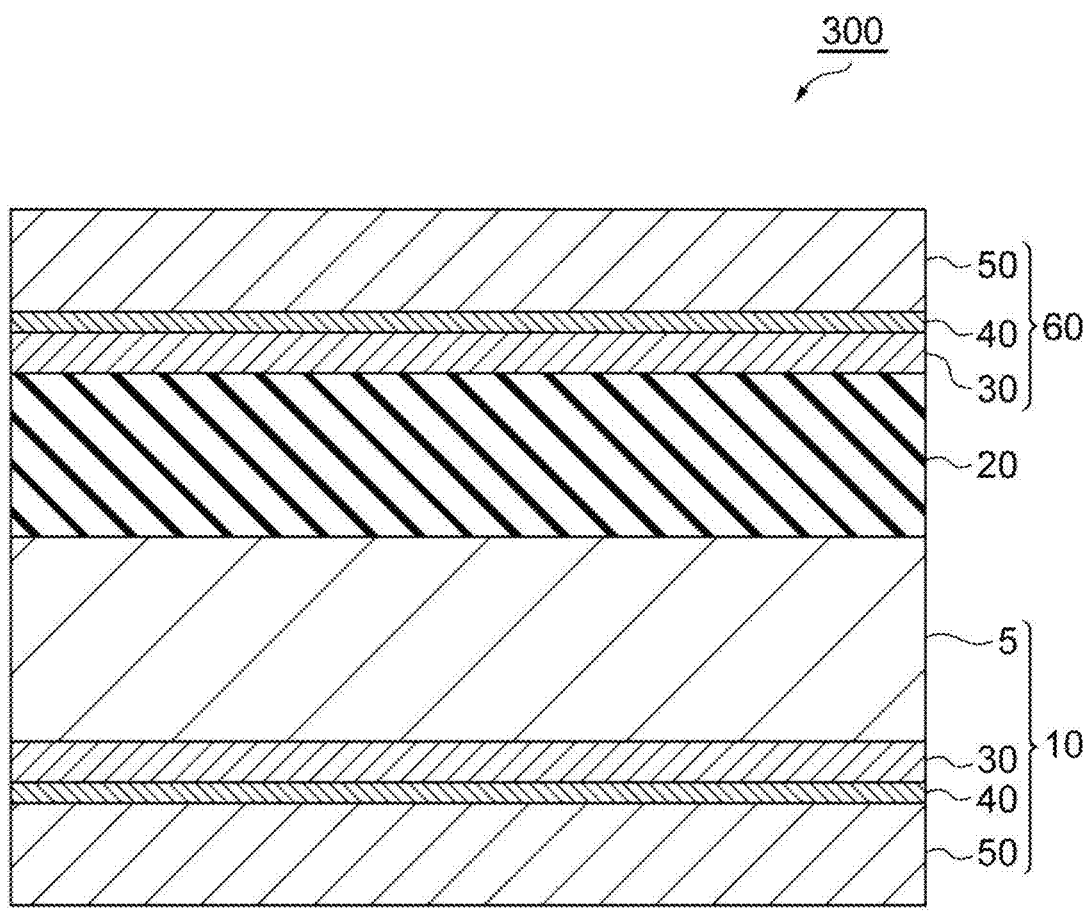
FIG. 4 is a schematic sectional view of a thin film capacitor according to a third embodiment of the present invention.

Subsequently, with reference to FIG. 4, a thin film capacitor 300 according to third embodiment will be described. The difference between the thin film capacitor 300 according to the present embodiment and the thin film capacitor 200 according to a second embodiment is only the first electrode 10. The first electrode 10 according to the present embodiment has an additional metallic layer 5 between the first metallic layer 30 and the dielectric substance 20. The thickness of the additional metallic layer 5 can be 0.1 to 10 m. The constitutional element for the additional metallic layer 5 can be a noble metal such as Pt or Au.

According to the present embodiment, there is an effect of further suppressing the mutual diffusion compared to the second embodiment.

Fourth Embodiment

Figure 5:
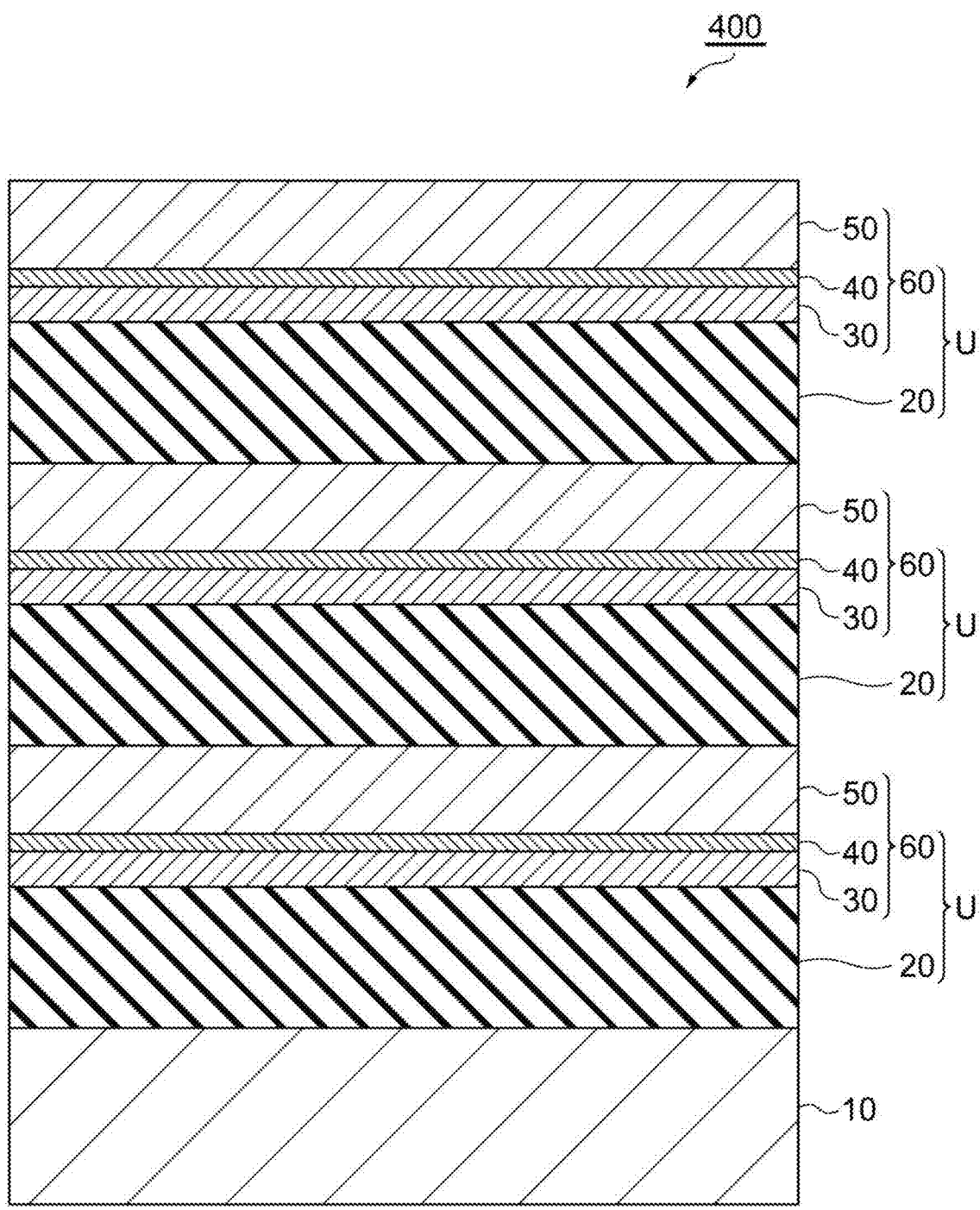
FIG. 5 is a schematic sectional view of a thin film capacitor according to a fourth embodiment of the present invention.

Subsequently, with reference to FIG. 5, a thin film capacitor 400 according to fourth embodiment will be described. Unlike the thin film capacitor 100 according to the first embodiment, in the thin film capacitor 400 according to the present embodiment, a plurality of laminate units U each comprising the dielectric substance 20 and the second electrode 60 is further laminated on the second electrode 60. The total number of laminate units U can be 2 to 20.

According to the present embodiment, the reliability is enhanced by the effect of suppressing the electric resistance after the heat treatment, and an effect of compatibility between high capacitance and a compact element due to lamination of the capacitor can be attained.

Fifth Embodiment

Figure 6:
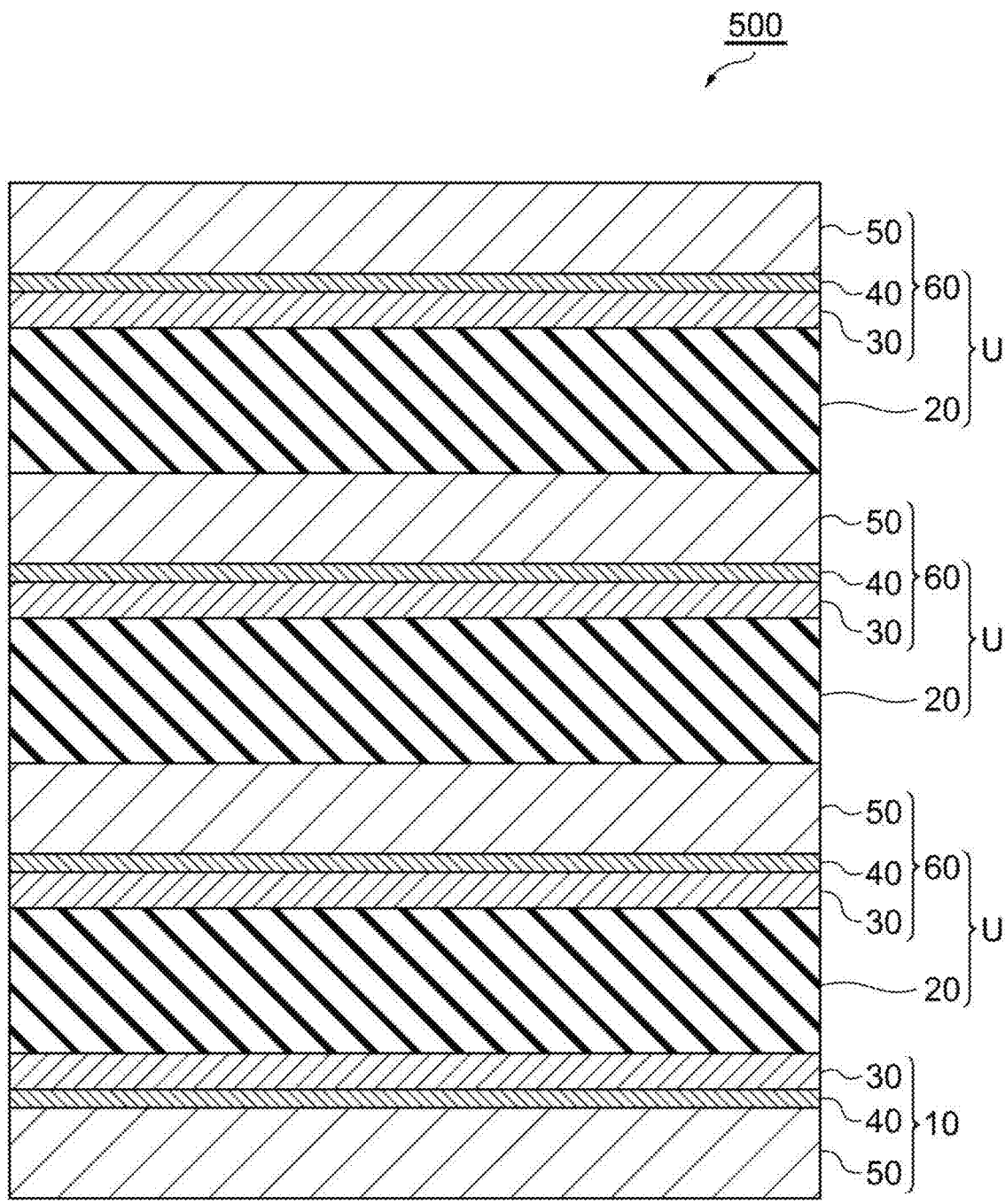
FIG. 6 is a schematic sectional view of a thin film capacitor according to a fifth embodiment of the present invention.

Subsequently, with reference to FIG. 6, a thin film capacitor 500 according to fifth embodiment will be described. Unlike the thin film capacitor 400 according to fourth embodiment, in the thin film capacitor 500 according to the present embodiment, the first electrode 10 is as the first electrode 10 in the thin film capacitor 200 of the second embodiment shown in FIG. 3, and is a laminate having a first metallic layer 30, an intermediate layer 40, and a second metallic layer 50 in sequence from the side of the dielectric substance 20.

According to the present embodiment, the reliability is enhanced by the further effect of suppressing the electric resistance after the heat treatment, and an effect of compatibility between high capacitance and a compact element due to lamination of the capacitor can be attained.

[Production Method]

Subsequently, one example of the method of producing a thin film capacitor according to the present embodiment will be described.

Here, a method of producing the thin film capacitor 100 according to the first embodiment will be exemplified.

First, a metal foil or the like is used to prepare a first electrode 10. Next, a dielectric substance 20 is formed on the first electrode 10 using a known method.

The method of forming the dielectric substance 20 may be a known method, for example, or may be a method using a chemical solution such as a sol gel method or a metal organic decomposition (MOD) method, a gas phase process such as MOCVD, CVD, sputtering, or PLD (pulse laser deposition), or a vapor deposition method.

Figure 7:
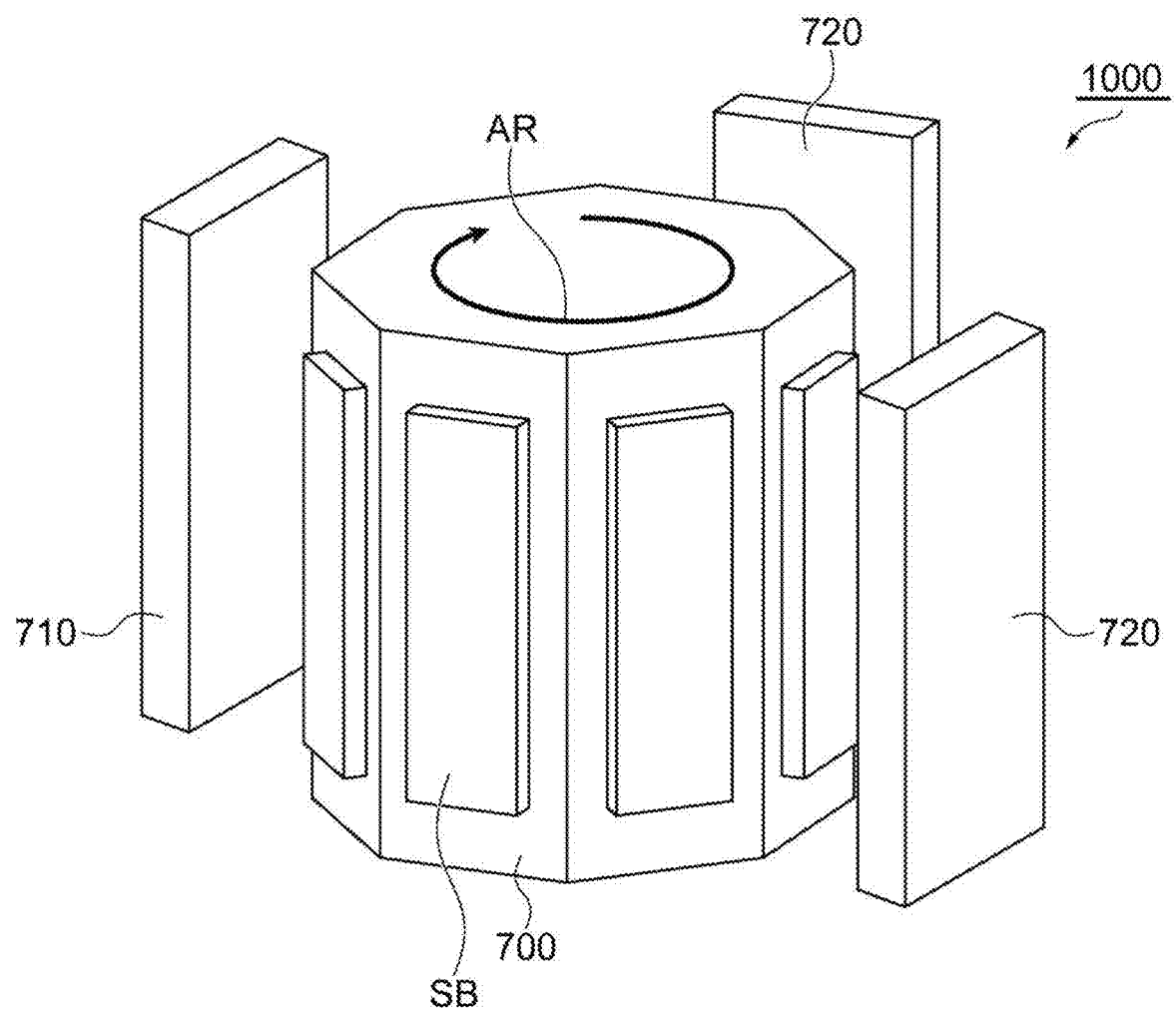
FIG. 7 is a perspective view of a method of producing a thin film capacitor according to an embodiment of the present invention.

Next, a second electrode 60 is formed on the dielectric substance 20. Here, a carousel type sputtering apparatus 1000 as shown in FIG. 7 is used.

This sputtering apparatus 1000 has a rotating body 700, a first target 710, and a second target 720.

The first target 710 contains the metal element M1 as a main component and the second target 720 contains the metal element M2 as a main component. The first target 710 and the second target 720 each are disposed at positions facing the circumferential surface of the rotating body 700.

A laminate SB having the first electrode 10 and the dielectric substance 20 produced above is fixed to the outer peripheral surface of the rotating body 700 such that the dielectric substance 20 is exposed on the surface thereof. A plurality of laminates SB can be fixed to the outer peripheral surface of the rotating body 700. The surface of the dielectric substance 20 is alternately approached to the first target 710 containing the metal element M1 as the main component and the second target 720 containing the metal element M2 as the main component through the rotation of the rotating body 700 around the axis thereof in the AR direction to alternately face the first target and the second target.

Figure 8:
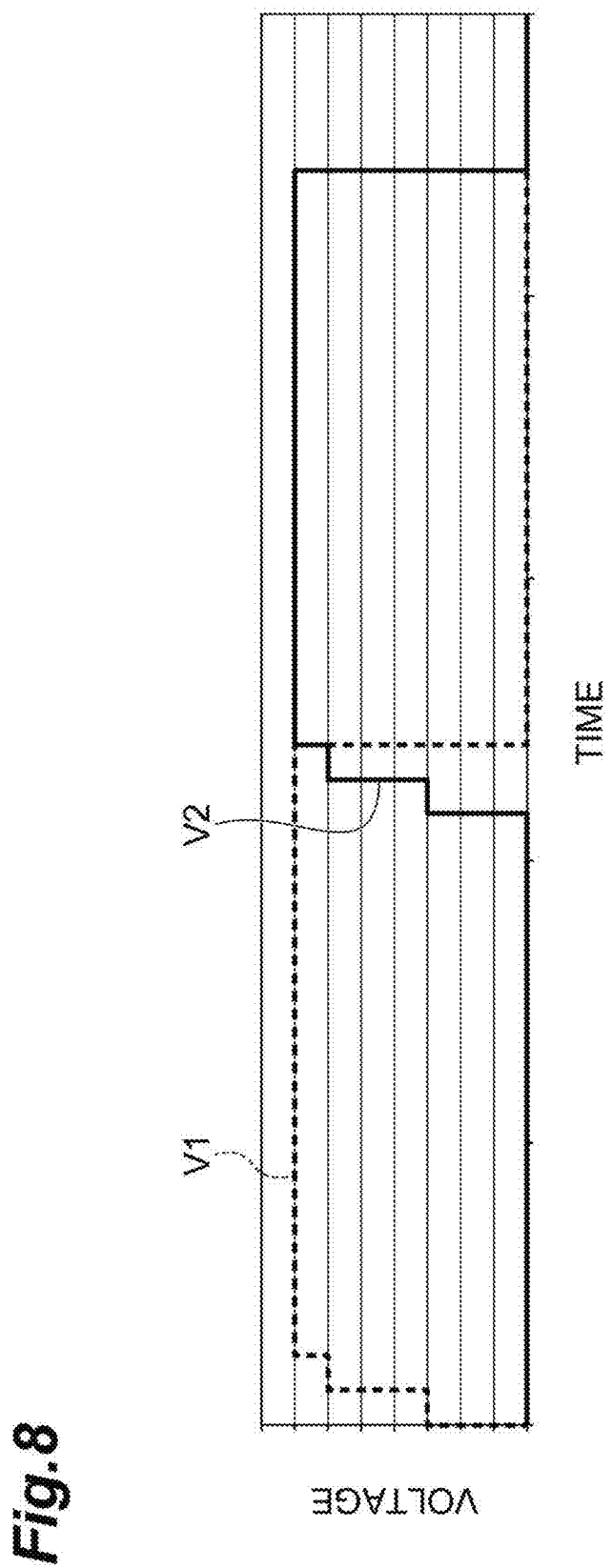
FIG. 8 is a graph showing changes over time of voltages V1 and V2 applied to a first target and a second target, respectively.

Next, while the rotating body 700 is being rotated at a predetermined rate, as shown in FIG. 8, a voltage V1 for sputtering is applied to the first target 710 to release a component containing the M1 element from the first target 710. To suppress generation of coarse M1 particles, it is suitable that the voltage V1 is increased stepwise. The rotation of the rotating body 700 is continued in the state where the maximum voltage of V1 is reached.

Thereby, the component containing the metal element M1 released from the first target 710 is repeatedly deposited on the surface of the dielectric substance 20 exposed to the first target 710 to form a first metallic layer 30 on the dielectric substance 20. The thickness of the first metallic layer 30 can be adjusted according to the sputtering time.

Next, as shown in FIG. 8, application of a voltage V2 for sputtering to the second target 720 is started in the state where the rotation of the rotating body 700 is kept and the voltage V1 for sputtering of the first target is kept. To suppress generation of coarse M2 particles, the voltage V2 is suitably increased stepwise. Thereby, a component containing the M2 element from the second target 720 is released.

The constitutional atoms are released from the both of the first target 710 and the second target 720; furthermore, the surface of the first metallic layer 30 fixed to the rotating body 700 is alternately approached to the first target 710 containing the metal element M1 as the main component and the second target 720 containing the metal element M2 as the main component to alternately face the first target and the second target. Accordingly, the time in which the component containing the metal element M1 released from the first target 710 is deposited on the surface of the first metallic layer 30 and the time in which the component containing the metal element M2 released from the second target 720 is deposited are alternately repeated. Thereby, a laminate structure 40*m* having the second metal sublayer 40*a* and the first metal sublayer 40*b* in this order on the first metallic layer 30 from the side of the first metallic layer 30 is obtained. For example, in this step, if the rotating body rotates two times, two laminate structures 40*m* are formed.

Next, the voltage V1 for sputtering of the first target is controlled to be 0 in the state where the rotation of the rotating body 700 is kept and the voltage V2 for sputtering of the second target 720 is controlled to be the maximum voltage. Thereby, only the component containing the M2 element released from the second target 720 is deposited on the laminate structure 40*m* to form a second metallic layer 50.

According to such a production method, the intermediate layer 40 can be easily formed. Moreover, control of the number of laminate structures 40*m* is facilitated. Moreover, if the release of the atom from the first target is kept during the start of release of the atom from the second target, generation of coarse powder of M2 particles is also suppressed.

The voltages V1 and V2 for sputtering and the rotational speed of the rotating body can be appropriately adjusted. For example, the rotational speed of the rotating body 700 can be 0.1 to 5 rpm.

The present invention is not limited to the embodiments above, and a variety of modification can be made. For example, the planar shape of the thin film capacitor is not particularly limited.

Moreover, the production of the thin film capacitor can be performed with a multi-target sputtering apparatus of a load-lock type or a cluster type rather than the carousel type.

Hereinafter, the present invention will be described by way of Examples further in detail, but the present invention will not be limited to these Examples.

Example A1

A Ni foil having a thickness of 28 m was prepared as a first electrode 10. A barium titanate layer of 600 nm as a dielectric substance 20 was formed on the first electrode 10. Using a carousel type sputtering apparatus as described in FIG. 7, a second electrode 60 having a first metallic layer 30, an intermediate layer 40, and a second metallic layer 50 was formed.

Figure 9:
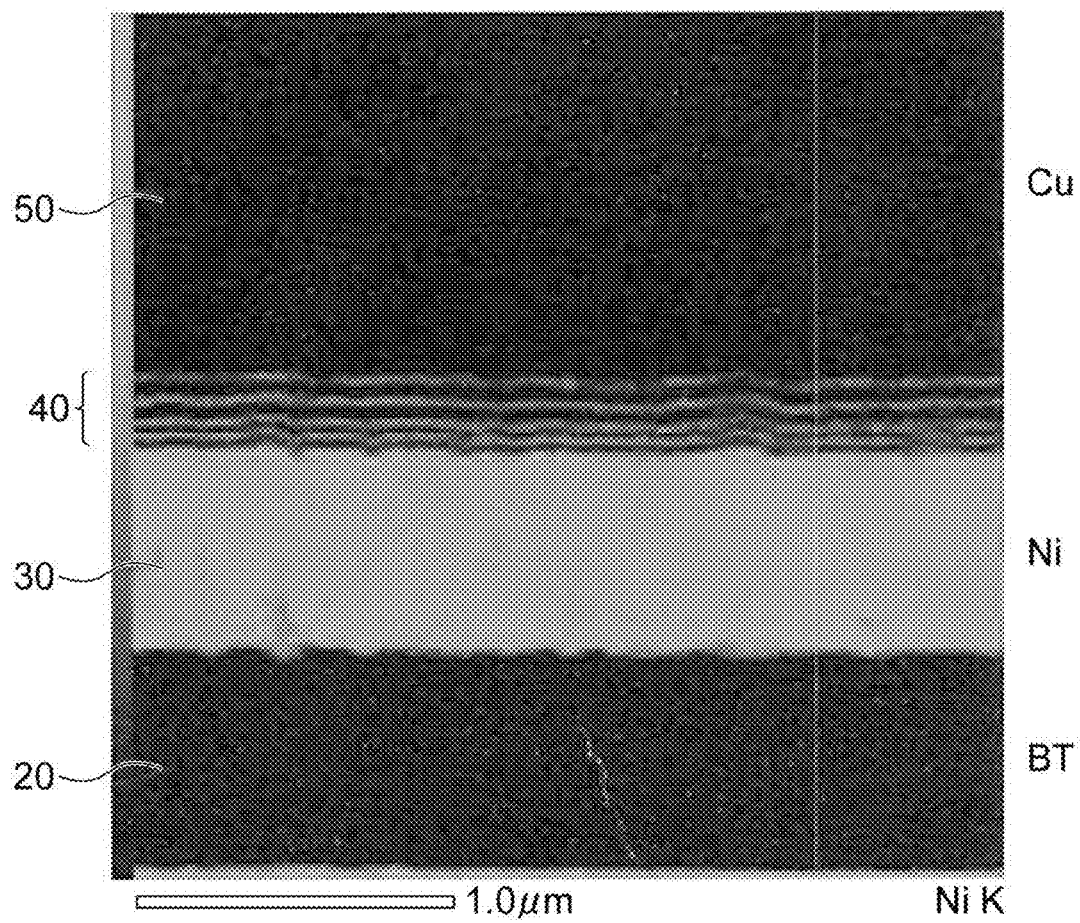
FIG. 9 is a cross-sectional SEM image of a thin film capacitor according to Example A1.

Ni was used as a material for the first metallic layer 30, and Cu was used as a material for the second metallic layer 50. The thickness of the first metallic layer 30 was 500 nm, the thicknesses of the first metal sublayer 40*b* and the second metal sublayer 40*a* were 20 nm, the number of laminate structures 40*m* was 4, and the thickness of the second metallic layer 50 was 2000 nm. The planar shape of the thin film capacitor was 1000 μm×500 μm. A cross-sectional SEM image of the thin film capacitor is shown in FIG. 9.

Comparative Example A1

A thin film capacitor of Comparative Example 1 was obtained in the same manner as in Example A1 except that the intermediate layer 40 was not formed.

(Evaluation)

The thin film capacitors were subjected to reflow treatment in a nitrogen atmosphere at a peak temperature of 260° C. for a treatment time of 5 seconds, and the ESR (equivalent series resistance) at an SRF (self-resonant frequency) was measured for the thin film capacitors. The ESR of Example A1 was 42.34 mΩ, and the ESR of Comparative Example A1 was 55.11 mΩ.

Examples B1 to B3

The operation was performed in the same manner as in Example A1 except that the thicknesses of the first metal sublayer 40*b* and the second metal sublayer 40*a* all were 10 nm, and the number of laminate structures 40*m* was sequentially 1, 4, and 8.

The ESRs thereof were 47.5 mΩ, 41.4 mΩ, and 53.3 mΩ, respectively.

Examples C1 to C2

The operation was performed in the same manner as in Example A1 except that the thicknesses of the first metal sublayer 40*b* and the second metal sublayer 40*a* all were 30 nm, and the number of laminate structures 40*m* was 1 and 4 in sequence.

The ESRs were 50.2 mΩ and 44.3 mΩ, respectively.

Example D1

The operation was performed in the same manner as in Example A1 except that the thicknesses of the first metal sublayer 40*b* and the second metal sublayer 40*a* all were 50 nm, and the number of laminate structures 40*m* was 4.

The ESR was 53.3 mΩ.

Compared to the cases where the intermediate layer 40 was not disposed, an increase in ESR of the thin film capacitor after the heat treatment can be suppressed by disposing the intermediate layer 40.

REFERENCE SIGNS LIST

5 . . . additional metallic layer, 10 . . . first electrode, 20 . . . dielectric substance, 60 . . . second electrode, 30 . . . first metallic layer, 40 . . . intermediate layer, 50 . . . second metallic layer, 40*a* . . . second metal sublayer, 40*b* . . . first metal sublayer, 40*m* . . . laminate structure, 100, 200, 300, 400, 500 . . . thin film capacitor, 700 . . . rotating body, 710 . . . first target, 720 . . . second target, 1000 . . . sputtering apparatus.

What is claimed is:

1. A thin film capacitor comprising:
   a first electrode;
   a second electrode; and
   a dielectric substance disposed between the first electrode and the second electrode, wherein
   the second electrode has a first metallic layer, an intermediate layer, and a second metallic layer in sequence in this order from the side of the dielectric substance,
   the first metallic layer contains a metal element M1 as a main component,
   the second metallic layer contains a metal element M2 different from the metal element M1 as a main component, and
   the intermediate layer has one or more laminate structures each having a second metal sublayer containing the metal element M2 as a main component and a first metal sublayer containing the metal element M1 as a main component in sequence from the side of the first metallic layer toward the side of the second metallic layer.

2. The thin film capacitor according to claim 1, wherein
the metal element M1 is any one metal selected from the group consisting of Ni, Pd, Pt, Au, Ru, Rh, and Ir, and
the metal element M2 is any one metal selected from the group consisting of Cu, Cr, Au, Ru, Rh, Ir, Mo, Ti, and W.

3. The thin film capacitor according to claim 1, wherein the intermediate layer has 2 to 10 of the laminate structures.

4. The thin film capacitor according to claim 1, wherein a thickness of the first metal sublayer and a thickness of the second metal sublayer both are 10 to 50 nm.

5. The thin film capacitor according to claim 1, wherein the first electrode has the first metallic layer, the intermediate layer, and the second metallic layer in sequence in this order from the side of the dielectric substance.

6. The thin film capacitor according to claim 5, wherein the first electrode further has an additional metallic layer between the first metallic layer and the dielectric substance.

* * * * *